(12) United States Patent
Sekimoto et al.

(10) Patent No.: US 10,160,013 B2
(45) Date of Patent: Dec. 25, 2018

(54) RINSING BATH AND SUBSTRATE CLEANING METHOD USING SUCH RINSING BATH

(71) Applicant: EBARA CORPORATION, Tokyo (JP)

(72) Inventors: Masahiko Sekimoto, Tokyo (JP); Toshio Yokoyama, Tokyo (JP); Kenichi Kobayashi, Tokyo (JP); Kenichi Akazawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/834,019

(22) Filed: Aug. 24, 2015

(65) Prior Publication Data

US 2016/0059271 A1   Mar. 3, 2016

(30) Foreign Application Priority Data

Sep. 1, 2014  (JP) .................................. 2014-177438

(51) Int. Cl.
*B08B 3/04* (2006.01)
*H01L 21/67* (2006.01)

(52) U.S. Cl.
CPC ........ *B08B 3/048* (2013.01); *H01L 21/67057* (2013.01)

(58) Field of Classification Search
None
See application file for complete search history.

(56) References Cited

U.S. PATENT DOCUMENTS

| | | | |
|---|---|---|---|
| 2,871,487 A * | 2/1959 | Fife | E03C 1/23 4/683 |
| 5,488,964 A * | 2/1996 | Murakami | B08B 3/02 118/326 |
| 2007/0229303 A1* | 10/2007 | Collier | G01F 23/0015 340/850 |
| 2008/0295239 A1* | 12/2008 | Ristuccia | A47K 3/024 4/589 |
| 2012/0240958 A1* | 9/2012 | Higuchi | H01L 21/67051 134/10 |

FOREIGN PATENT DOCUMENTS

| | | |
|---|---|---|
| JP | 61-061425 | 3/1986 |
| JP | H11-121424 A | 4/1999 |
| JP | 2000-266465 A | 9/2000 |
| JP | 2007-266253 A | 10/2007 |
| JP | 2008-211038 A | 9/2008 |
| JP | 2009-152291 A | 7/2009 |
| JP | 2010-123874 A | 6/2010 |
| JP | 2012-178512 A | 9/2012 |
| WO | WO 00/70128 A1 | 11/2000 |

\* cited by examiner

*Primary Examiner* — Rita P Adhlakha
(74) *Attorney, Agent, or Firm* — Baker & Hostetler LLP

(57) ABSTRACT

A rinsing bath which can simplify a discharging structure of a rinsing liquid is disclosed. The rinsing bath includes an inner bath for storing the rinsing liquid, an overflow bath configured to receive the rinsing liquid overflowing the inner bath, a stopper for closing a drain hole provided on a bottom of the inner bath, an actuator configured to move the stopper between a closing position in which the stopper closes the drain hole and a opening position in which the stopper is away from the drain hole, a rinsing liquid supply pipe configured to supply the rinsing liquid into the inner bath, and a drain pipe coupled to a bottom of the overflow bath. The drain hole communicates between an inside of the inner bath and an inside of the overflow bath.

8 Claims, 8 Drawing Sheets

US 10,160,013 B2

RINSING BATH AND SUBSTRATE CLEANING METHOD USING SUCH RINSING BATH

CROSS REFERENCE TO RELATED APPLICATION

This document claims priority to Japanese Patent Application Number 2014-177438 filed Sep. 1, 2014, the entire contents of which are hereby incorporated by reference.

BACKGROUND

A wet processing apparatus is known as an apparatus for processing a substrate, such as a wafer. An electroplating apparatus, an electroless plating apparatus, and a wet etching apparatus are examples of the wet processing apparatus. Such wet processing apparatus generally includes a processing bath for holding a processing liquid therein for processing a substrate, and a rinsing bath for holding a rinsing liquid therein for cleaning the processed substrate. The substrate is immersed in the processing liquid held in the processing bath, so that the substrate is processed. Thereafter, the substrate is transported to the rinsing bath, and is immersed in the rinsing liquid held in the rinsing bath, so that the substrate is cleaned (or rinsed). Hereinafter, the rinsing bath will be described with reference to FIG. 8.

FIG. 8 is a view showing a typical rinsing bath. As shown in FIG. 8, the rinsing bath includes an inner bath 101 for holding the rinsing liquid therein, and an overflow bath 102 surrounding the inner bath 101. A drain pipe 103 is coupled to a bottom of the overflow bath 102, and a discharge valve 104 is attached to the drain pipe 103. One end of a drain pipe 105 is coupled to a bottom of the inner bath 101, and other end of the drain pipe 105 is coupled to the drain pipe 103. A discharge valve 106 is attached to the drain pipe 105. The drain pipe 105 extends through the bottom of the overflow bath 102. In order to prevent a leakage of the rinsing liquid from the overflow bath 102, a packing 112 for sealing a gap between the bottom of the overflow bath 102 and the drain pipe 105 is provided.

A rinsing liquid supply pipe 110 for supplying the rinsing liquid is coupled to the bottom of the inner bath 101, and an on-off valve 111 is attached to the rinsing liquid supply pipe 110. When the on-off valve 111 is opened, the rinsing liquid is supplied through the rinsing liquid supply pipe 110 into the inner bath 101. With the discharge valve 106 closed, the rinsing liquid is gradually stored in the inner bath 101. The rinsing liquid stored in the inner bath 101 eventually overflows the inner bath 101 into the overflow bath 102.

A substrate W that has been processed in a processing bath (not shown) is transported to a predetermined position above the inner bath 101. With the on-off valve 111 opened, i.e., while the rinsing liquid is being supplied into the inner bath 101, the substrate W is immersed in the rinsing liquid retained in the inner bath 101, whereby the substrate W is cleaned (rinsed). The rinsing liquid overflows the inner bath 101 into the overflow bath 102 during cleaning of the substrate W. Further, the rinsing liquid in the overflow bath 102 is discharged through the drain pipe 103 to an exterior. After cleaning of the substrate W, the discharge valve 106 is opened, and the rinsing liquid stored in the inner bath 101 is discharged through the drain pipe 105 and the drain pipe 103 to the exterior.

A pamphlet of International Publication No. 00/070128 discloses a water-washing bath having a quick dump function provided in an electroplating apparatus. Further, Japanese laid-open patent publication No. 61-61425 discloses a water-washing bath having an inner bath and an overflow bath.

In the rinsing bath illustrated in FIG. 8, it is necessary to provide two drain pipes, i.e., the drain pipe 105 for discharging the rinsing liquid from the inner bath 101 and the drain pipe 103 for discharging the rinsing liquid from the overflow bath 102. Further, it is necessary to provide the drain pipes 103, 105 with the drain valves 104, 106, respectively. Therefore, a structure for discharging the rinsing liquid is complicated, and a large space is required for installing the drain pipes 103, 105 and the drain valves 104, 106.

Further, from a point in time when the rinsing liquid fills the inner bath 101 to a point in time when the substrate W is introduced into the inner bath 101, a large amount of the rinsing liquid, which does not contribute to cleaning of the substrate, is discharged through the drain pipe 103, and as a result, a total amount of the rinsing liquid used increases. Further, since an amount of the rinsing liquid that can be held by the inner bath 101 includes not only a volume of the inner bath 101 itself, but also a volume from the bottom of the inner bath 101 to the drain valve 106, more rinsing liquid than necessary is required. In order to reduce the amount of the rinsing liquid to be used, the supply of the rinsing liquid may be stopped by closing the on-off valve 111 until the substrate W is immersed in the rinsing liquid. However, if a flow of the rinsing liquid is stagnant, bacteria may be generated in a flow passage of the rinsing liquid, resulting in a contamination of the rinsing liquid.

SUMMARY OF THE INVENTION

According to an embodiment, there is provided a rinsing bath with a simple structure for discharging a rinsing liquid and/or capable of reducing an amount of rinsing liquid to be used without stopping a flow of the rinsing liquid. Further, according to an embodiment, there is provided a substrate cleaning method using such a rinsing bath.

Embodiments, which will be described below, relate to a rinsing bath for cleaning a substrate, such as a wafer, and a substrate cleaning method using such a rising bath.

In an embodiment, there is provided a rinsing bath comprising: an inner bath for holding a rinsing liquid therein; an overflow bath configured to receive the rinsing liquid that has overflowed the inner bath; a stopper configured to close a drain hole provided in a bottom of the inner bath, the drain hole providing a fluid communication between an inside of the inner bath and an inside of the overflow bath; an actuator configured to move the stopper between a closing position at which the stopper closes the drain hole and an opening position at which the stopper is away from the drain hole; a rinsing liquid supply pipe configured to supply the rinsing liquid into the inner bath; and a drain pipe coupled to a bottom of the overflow bath.

In an embodiment, the actuator is disposed above the inner bath.

In an embodiment, the rinsing bath further comprises a flow rate controller configured to change a flow rate of the rinsing liquid flowing through the rinsing liquid supply pipe.

In an embodiment, the rinsing bath further comprises a level detector configured to detect a level of the rinsing liquid in the inner bath, wherein the flow rate controller is configured to allow the rinsing liquid to flow through the rinsing liquid supply pipe at a first flow rate until the level of the rinsing liquid reaches a predetermined level, and limit the flow rate of the rinsing liquid, flowing through the rinsing liquid supply pipe, to a second flow rate which is lower than the first flow rate, after the level of the rinsing liquid reaches the predetermined level.

In an embodiment, the flow rate controller comprises an on-off valve attached to the rinsing liquid supply pipe and a bypass pipe which bypasses the on-off valve.

In an embodiment, there is provided a method of cleaning a substrate using a rinsing bath which has an inner bath and an overflow bath surrounding the inner bath, comprising: supplying a rinsing liquid into the inner bath at a first flow rate until a level of the rinsing liquid in the inner bath reaches a predetermined level; supplying the rinsing liquid into the inner bath at a second flow rate, which is lower than the first flow rate, after the level of the rinsing liquid in the inner bath reaches the predetermined level; cleaning the substrate with the rinsing liquid by immersing the substrate in the rinsing liquid in the inner bath while supplying the rinsing liquid into the inner bath at a flow rate which is higher than the second flow rate and causing the rinsing liquid to overflow the inner bath into the overflow bath; pulling the substrate out of the rinsing liquid; stopping the supply of the rinsing liquid into the inner bath; and then discharging the rinsing liquid from the inner bath.

In an embodiment, the method further comprises closing a drain hole provided in a bottom of the inner bath with a stopper before supplying the rinsing liquid into the inner bath, wherein discharging the rinsing liquid from the inner bath comprises moving the stopper away from the drain hole to cause the rinsing liquid in the inner bath to flow through the drain hole into the overflow bath, while discharging the rinsing liquid from the overflow bath through a drain pipe coupled to a bottom of the overflow bath.

According to the above-described embodiments, it is not necessary to couple a drain pipe to the inner bath. Therefore, a structure of discharging the rinsing liquid can be simple. Moreover, it is not necessary to provide the packing 112 shown in FIG. 8.

Further, according to the above-described embodiments, the flow rate controller can lower the flow rate of the rinsing liquid flowing through the rinsing liquid supply pipe until just before the substrate is immersed in the rinsing liquid. Therefore, an amount of the rinsing liquid to be used can be reduced, and a contamination of the rinsing liquid can be prevented.

DESCRIPTION OF EMBODIMENTS

Figure 1:
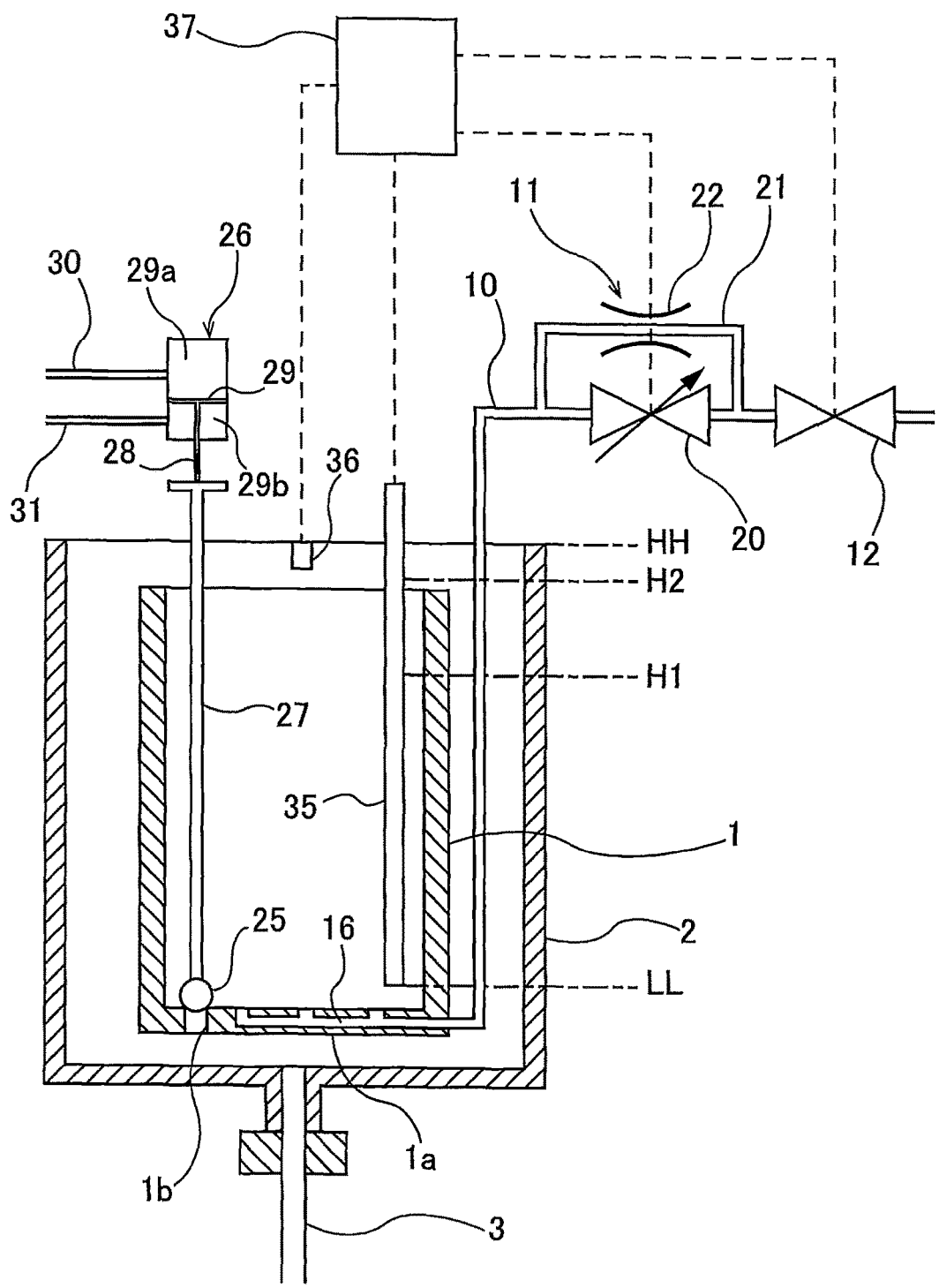
FIG. 1 is a view showing a rinsing bath according to an embodiment.

Embodiments will now be described with reference to the drawings. The same reference numerals are used in FIGS. 1 through 7 to refer to the same or corresponding elements, and duplicate descriptions thereof will be omitted.

FIG. 1 is a view showing a rinsing bath according to an embodiment. As shown in FIG. 1, the rinsing bath includes an inner bath 1 for holding a rinsing liquid therein, and an overflow bath 2 surrounding the inner bath 1. The entirety of the inner bath 1 is located in the overflow bath 2. The overflow bath 2 is configured to receive the rinsing liquid that has overflowed the inner bath 1.

A drain pipe 3 is coupled to a bottom of the overflow bath 2. The inner bath 1 is separated from the bottom of the overflow bath 2. A drain hole 1b, through which the rinsing liquid in the inner bath 1 is passed into the overflow bath 2, is provided in the inner bath 1. The drain hole 1b is formed in a bottom 1a of the inner bath 1, and provides a fluid communication between an inside of the inner bath 1 and an inside of the overflow bath 2.

The rinsing bath includes a rinsing liquid supply pipe 10 for supplying the rinsing liquid into the inner bath 1, and a flow rate controller 11 for changing a flow rate of the rinsing liquid flowing through the rinsing liquid supply pipe 10. A main valve 12, for starting and stopping a supply of the rinsing liquid into the inner bath 1, is attached to the rinsing liquid supply pipe 10. The rinsing liquid supply pipe 10 is coupled to the bottom 1a of the inner bath 1. A liquid passage 16, which provides a fluid communication between the rinsing liquid supply pipe 10 and the inside of the inner bath 1, is formed in the bottom 1a of the inner bath 1. The rinsing liquid supplied from the rinsing liquid supply pipe 10 flows into the inner bath 10 through the liquid passage 16. Pure water may be used as the rinsing liquid.

The flow rate controller 11 is disposed downstream of the main valve 12. The flow rate controller 11 includes an on-off valve 20 attached to the rinsing liquid supply pipe 10, and a bypass pipe 21 which bypasses the on-off valve 20. One end of the bypass pipe 21 is coupled to the rinsing liquid supply pipe 10 at a location between the main valve 12 and the on-off valve 20. Other end of the bypass pipe 21 is coupled to the rinsing liquid supply pipe 10 at a location downstream of the on-off valve 20. The bypass pipe 21 has an orifice 22 for limiting the flow rate of the rinsing liquid passing through the bypass pipe 21.

When the main valve 12 is opened, the rinsing liquid is supplied into the inner bath 1 through the rinsing liquid supply pipe 10 and the flow rate controller 11. A flow rate of the rinsing liquid when the on-off valve 20 is in an open state is a first flow rate. When the on-off valve 20 is closed, the rinsing liquid is supplied into the inner bath 1 through the bypass pipe 21 and the rinsing liquid supply pipe 10. A flow rate of the rinsing liquid when the on-off valve 20 is in a closed state is a second flow rate which is lower than the first flow rate. In this manner, the flow rate controller 11 can change the flow rate of the rinsing liquid flowing through the rinsing liquid supply pipe 10 by opening and closing the on-off valve 20. A flow rate regulating valve may be used as the flow rate controller 11.

The rinsing bath includes a stopper 25 for closing the drain hole 1b provided in the bottom 1a of the inner bath 1, and a pneumatic cylinder 26 as an actuator for moving the stopper 25. The pneumatic cylinder 26 is configured to move the stopper 25 between a closing position at which the stopper 25 closes the drain hole 1b and an opening position at which the stopper 25 is separated away from the drain hole 1b. The pneumatic cylinder 26 is disposed above the inner bath 1, and is coupled to the stopper 25 through a rod 27 extending in a vertical direction.

The pneumatic cylinder 26 includes a piston 29 and a piston rod 28 secured to the piston 29. An internal space of the pneumatic cylinder 26 is divided into a first pressure chamber 29a and a second pressure chamber 29b by the piston 29. An upper end of the rod 27 is coupled to the piston rod 28 of the pneumatic cylinder 26, and the stopper 25 is secured to a lower end of the rod 27.

Two gas delivery conduits 30, 31 are coupled to the pneumatic cylinder 26. These gas delivery conduits 30, 31 are coupled to a gas supply source (not shown). When a gas is supplied into the first pressure chamber 29a of the pneumatic cylinder 26 through the gas delivery conduit 30, the piston 29 and the piston rod 28 are moved downwardly, thereby moving the stopper 25 to the closing position at which the stopper 25 closes the drain hole 1b. Since a size of the stopper 25 is larger than the drain hole 1b, the stopper 25 can close the drain hole 1b.

Figure 2:
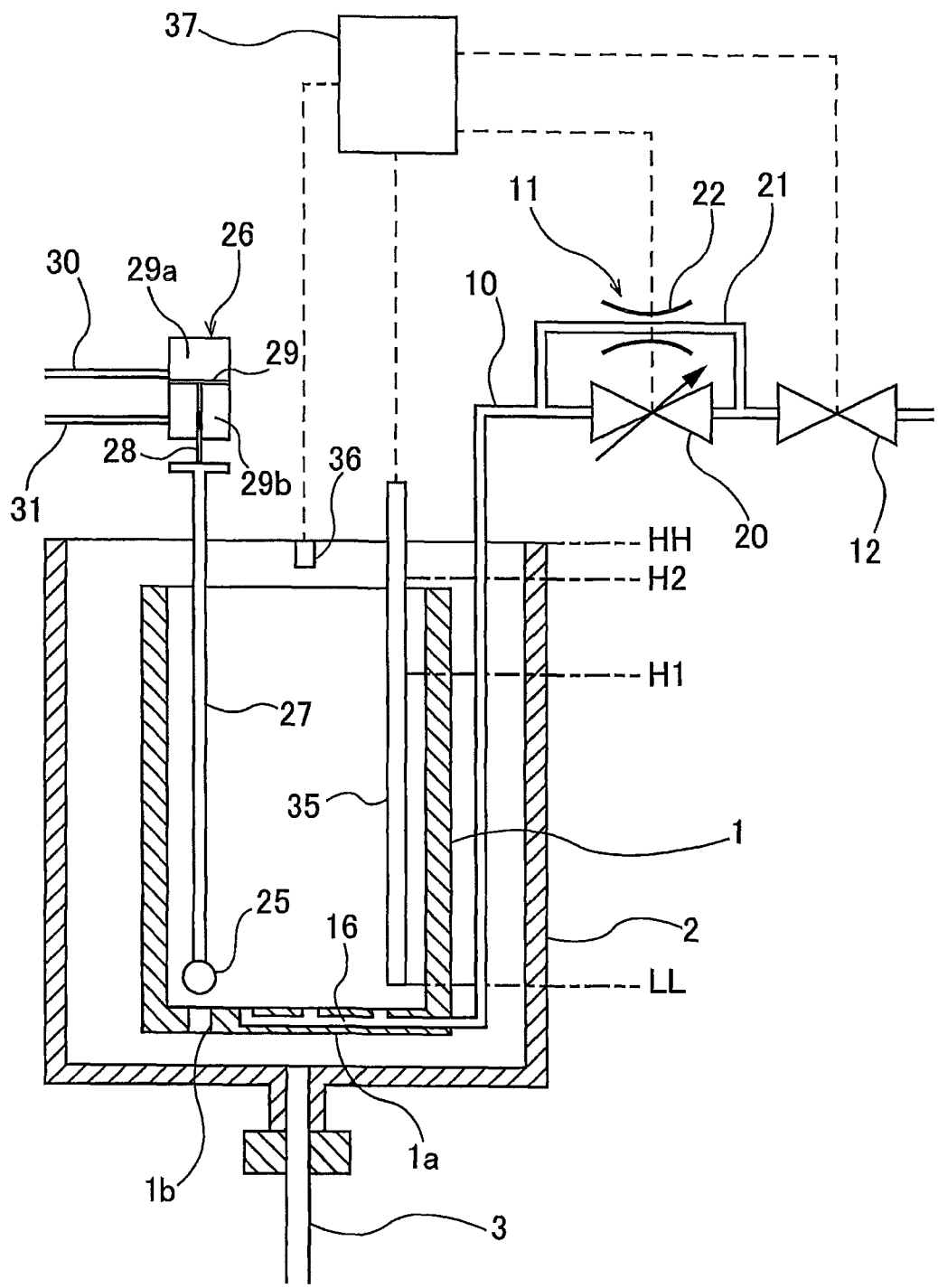
FIG. 2 is a view showing the rinsing bath with a stopper away from a drain hole.

FIG. 2 is a view showing the stopper 25 that has been moved to the opening position. As shown in FIG. 2, when a gas is supplied into the second pressure chamber 29b of the pneumatic cylinder 26 through the gas delivery conduit 31, the piston 29 and the piston rod 28 are moved upwardly, thereby moving the stopper 25 to the opening position at which the stopper 25 is separated from the drain hole 1b. By moving the stopper 25 upwardly, the drain hole 1b is opened. The actuator, which moves the stopper 25, may be another device, such as a combination of a servomotor and a ball screw, instead of the pneumatic cylinder.

Figure 8:
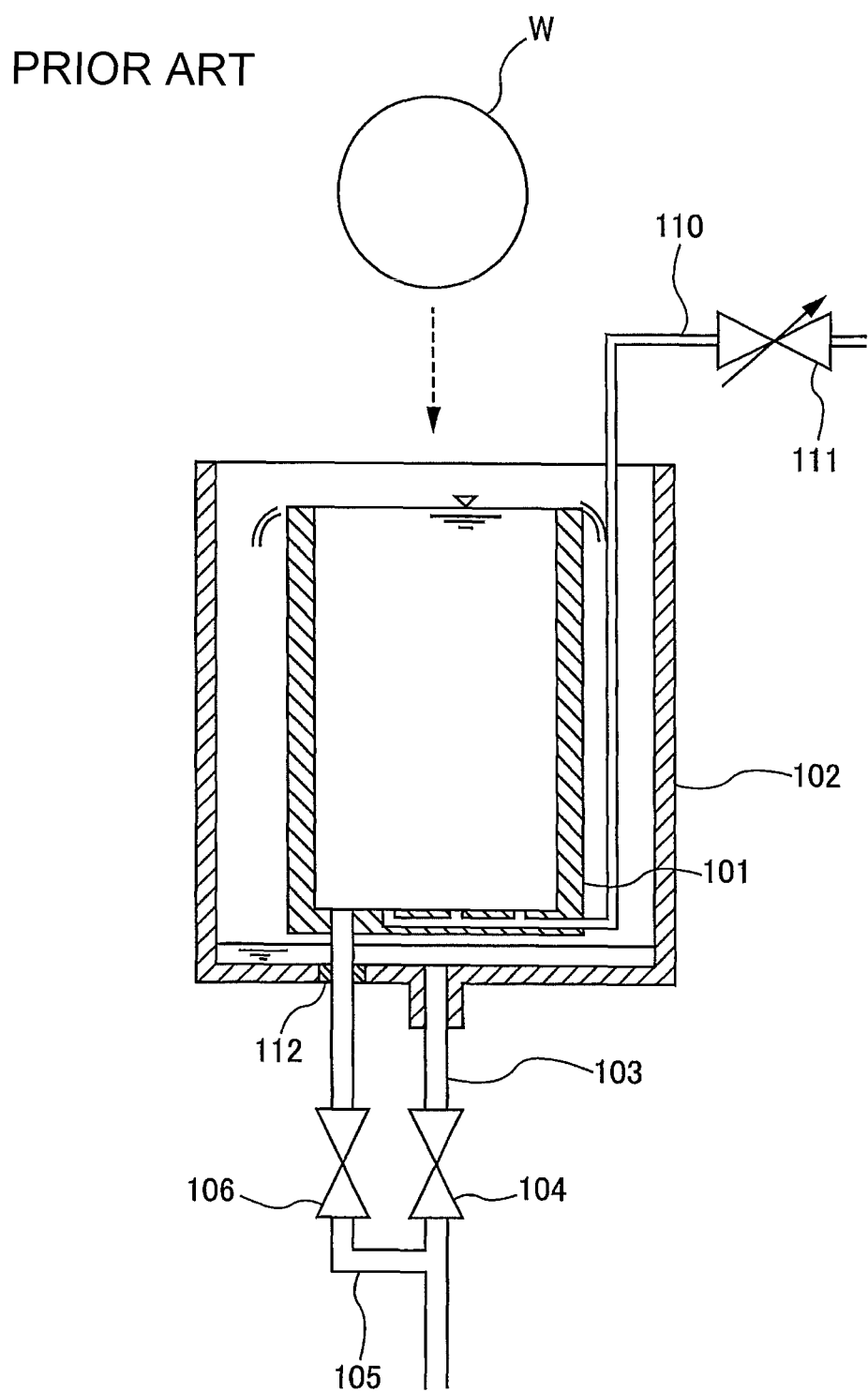
FIG. 8 is a view showing a typical rinsing bath.

The rinsing liquid in the inner bath 1 flows through the drain hole 1b into the overflow bath 2, and is discharged from the overflow bath 2 through the drain pipe 3. With this structure, it is not necessary to connect a drain pipe to the inner bath 1. Therefore, a structure for discharging the rinsing liquid can be simple, and a space required for installing the structure for discharging the rinsing liquid can be small. Further, the inner bath 1 can be easily detached from the overflow bath 2 for maintenance. Moreover, it is not necessary to provide the packing 112 shown in FIG. 8.

The rinsing bath includes a first level detector 35 for detecting a level of the rinsing liquid held in the inner bath 1, and a second level detector 36 for detecting a level of the rinsing liquid held in the overflow bath 2. The first level detector 35 may be a level sensor capable of detecting a plurality of liquid levels, and the second level detector 36 may be a float type level detector.

As shown in FIG. 1 and FIG. 2, the first level detector 35 is configured to detect three liquid levels, i.e., a lower limit level LL, a first level H1, and a second level H2. The lower limit level LL is slightly higher than the bottom 1a of the inner bath 1. The first level H1 is slightly lower than an upper end of the inner bath 1. The second level H2 is slightly higher than the upper end of the inner bath 1.

The rinsing bath further includes an operation controller 37 for controlling an operation of the flow rate controller 11. More specifically, the operation controller 37 is configured to control operations of the main valve 12 and the on-off valve 20 based on the levels of the rinsing liquid in the inner bath 1 and the overflow bath 2. The first level detector 35 is coupled to the operation controller 37, which is coupled to the main valve 12 and the on-off valve 20. When the first level detector 35 detects any one of the above-described three levels, the operation controller 37 opens or closes the main valve 12 and/or the on-off valve 20.

Since the second level H2 is slightly higher than the upper end of the inner bath 1, the level of the rinsing liquid does not reach the second level H2 as long as the rinsing bath functions normally. If the first level detector 35 has detected the second level H2, it indicates the fact that draining of the overflow bath 2 is not performed properly, i.e., the rinsing liquid is not properly discharged from the overflow bath 2, and as a result, the level of the rinsing liquid has reached the second level H2. If the first level detector 35 has detected the second level H2 during processing of a substrate, the processing of the substrate is continued. An alarm is then generated and processing of a next substrate is not performed. The second level detector 36 is configured to detect an upper limit level HH and is coupled to the operation controller 37. The upper limit level HH is the same height as the upper end of the overflow bath 2. When the second level detector 36 detects the upper limit level HH, the operation controller 37 closes the main valve 12. As a result, an overflow of the rinsing liquid from the overflow bath 2 is prevented.

Figure 3:
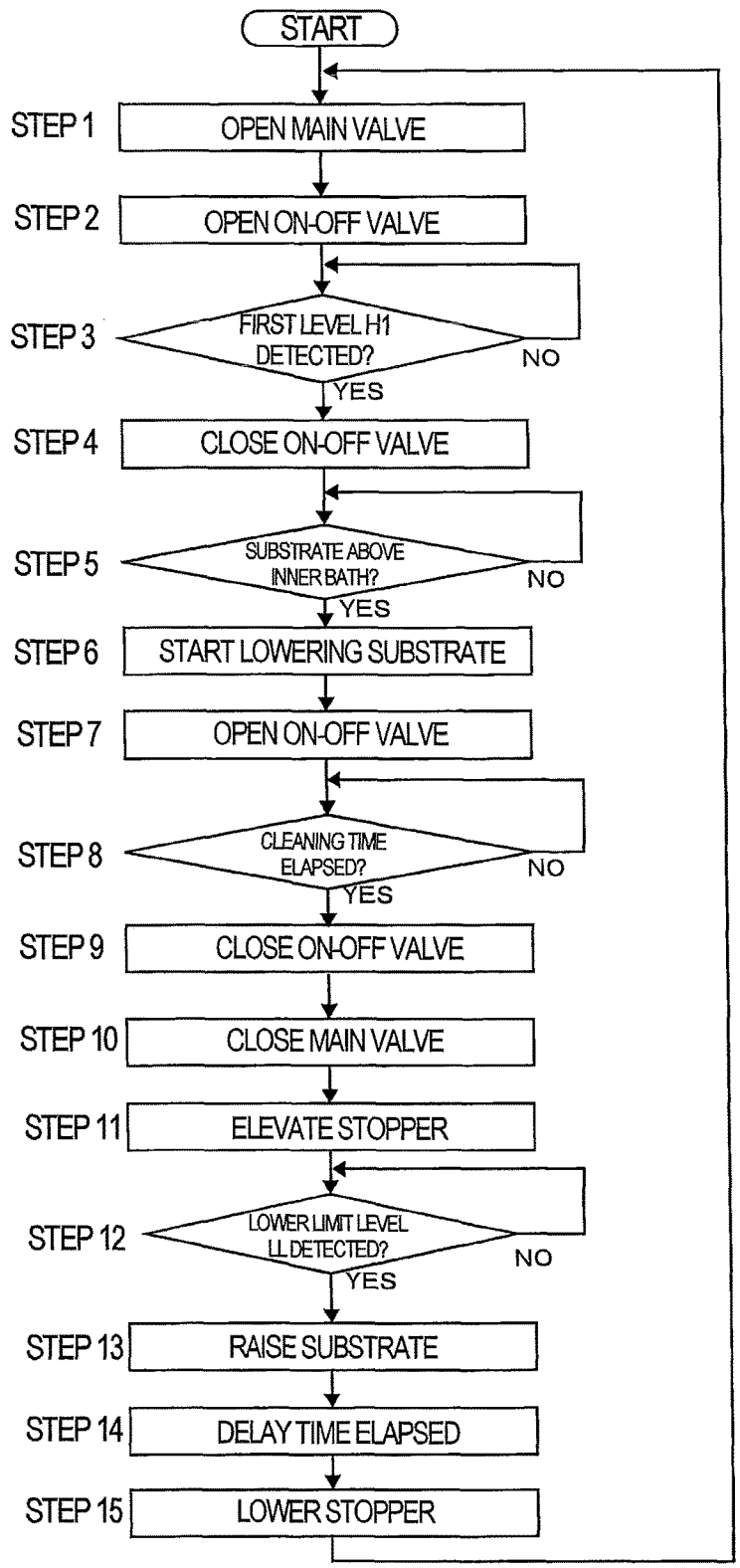
FIG. 3 is a flow chart showing a supply and discharge process of a rinsing liquid in a case where a quick dump rinse is performed.
Figure 4:
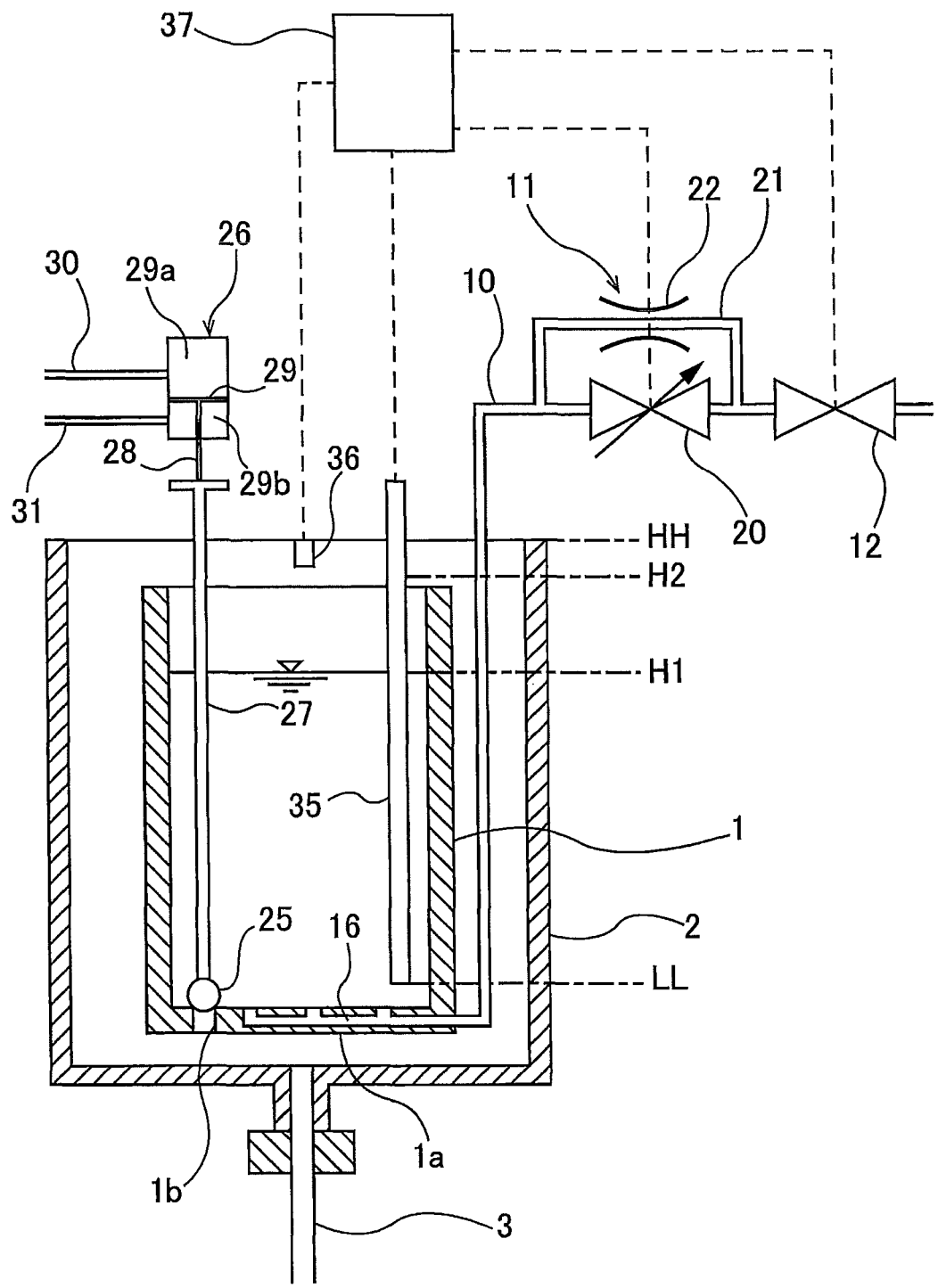
FIG. 4 is a view showing the rinsing bath when a level of the rinsing liquid has reached a first level H1.

Next, a method of cleaning a substrate W will be described with reference to FIG. 3. Examples of the substrate W to be cleaned include a plated wafer and a wafer that has been subjected to a wet etching process. FIG. 3 is a flow chart showing the method of cleaning the substrate W. With the stopper 25 closing the drain hole 1b of the inner bath 1, the main valve 12 is opened (step 1), and the on-off valve 20 is then opened (step 2). As a result, the rinsing liquid is supplied through the rinsing liquid supply pipe 10 into the inner bath 1 at the first flow rate. The level of the rinsing liquid in the inner bath 1 reaches the lower limit level LL, and then reaches the first level H1. FIG. 4 is a view showing the rinsing bath when the level of the rinsing liquid has reached the first level H1.

When the first level detector 35 detects the first level H1 (step 3), the first level detector 35 sends a detection signal to the operation controller 37. Upon receiving the detection signal from the first level detector 35, the operation controller 37 closes the on-off valve 20 (step 4).

Figure 5:
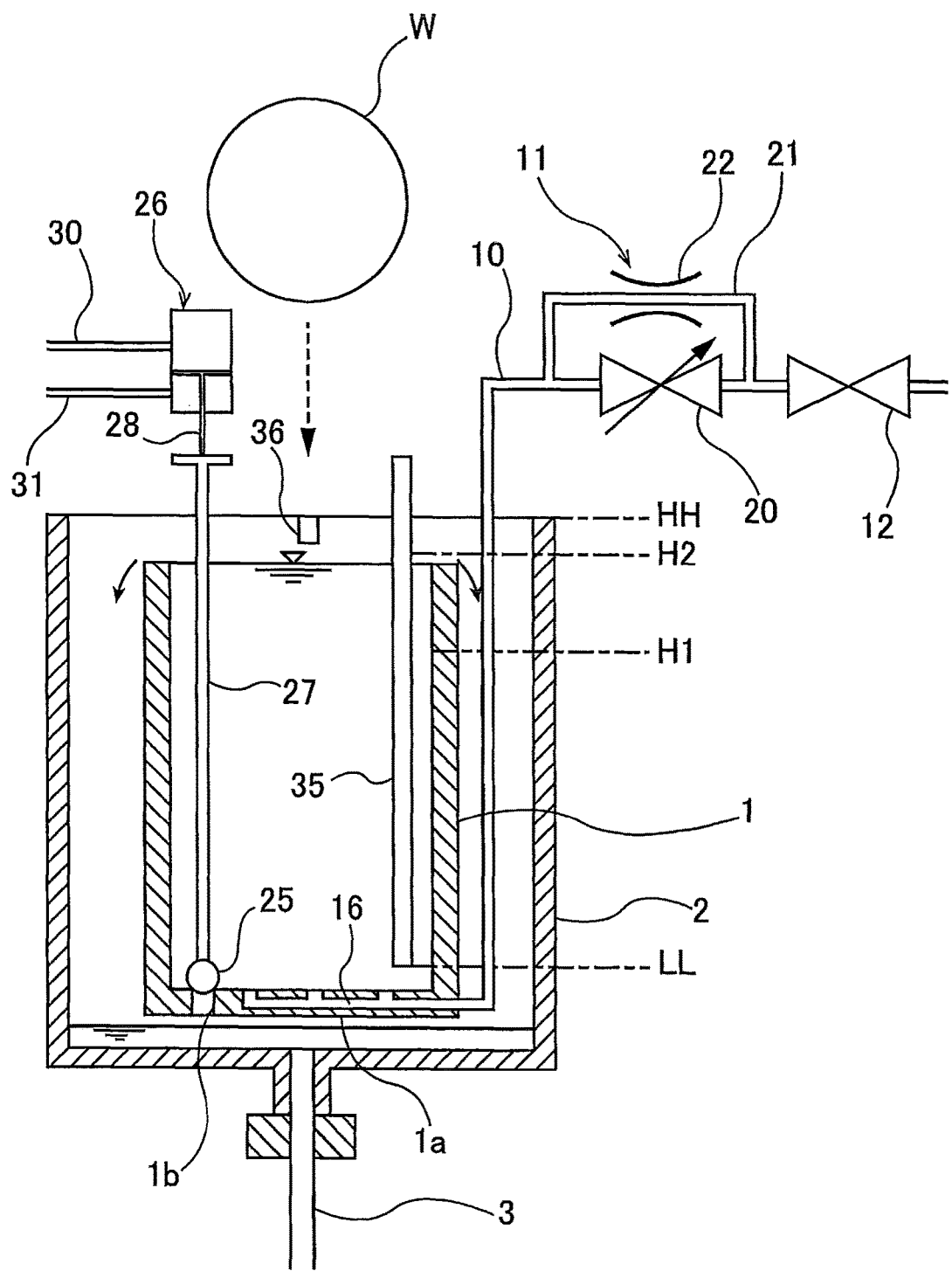
FIG. 5 is a view showing the rinsing bath when the rinsing liquid overflows an inner bath into an overflow bath.

When the on-off valve 20 is in the closed state, the rinsing liquid is supplied through the bypass pipe 21 into the inner bath 1. That is, the flow rate of the rinsing liquid supplied into the inner bath 1 is changed from the first flow rate to the second flow rate (the first flow rate> the second flow rate). The rinsing liquid overflows the inner bath 1 into the overflow bath 2 (see FIG. 5). The rinsing liquid that has flowed into the overflow bath 2 is discharged through the drain pipe 3 to the exterior. In FIG. 5, the operation controller 37 is not depicted.

As described above, the substrate W, such as a wafer, is processed in a processing bath, and is then transported to the rinsing bath. If the rinsing liquid is continuously supplied at the first flow rate until the substrate W is transported to a predetermined position above the rinsing bath, a large amount of rinsing liquid, which does not contribute to the substrate cleaning, is discharged to the exterior through the drain pipe 3. According to the embodiment, after the level of the rinsing liquid has reached the first level H1 close to the upper end of the inner bath 1, the rinsing liquid is supplied at the second flow rate that is lower than the first flow rate. That is, a smaller amount of rinsing liquid is discharged through the drain pipe 3 without stopping the flow of the rinsing liquid supplied into the inner bath 1. Therefore, a generation of bacteria is prevented, while an amount of the rinsing liquid to be used can be reduced.

When the substrate W is transported to a predetermined position (i.e., a substrate lowering position) above the inner bath 1 (step 5), lowering of the substrate W is started (step 6). Thereafter, the on-off valve 20 is opened (step 7), so that the rinsing liquid is changed from the second flow rate to the first flow rate. The substrate W is immersed in the rinsing liquid in the inner bath 1 and cleaned (i.e., rinsed) with the rinsing liquid, while the rinsing liquid is supplied into the inner bath 1 at the first flow rate that is higher than the second flow rate and the rinsing liquid overflows the inner bath 1 into the overflow bath 2. When a predetermined cleaning time has elapsed since cleaning of the substrate W is started (step 8), the on-off valve 20 is closed (step 9), whereby cleaning of the substrate W is terminated. The flow rate of the rinsing liquid, when supplied into the inner bath 1 during cleaning of the substrate W, may not be the first flow rate, and is not limited particularly so long as the flow rate is higher than the second flow rate.

There is a cleaning method called a quick dump rinse (QDR) which is one example of a method of cleaning a substrate W. This cleaning method (QDR) includes the steps of immersing the substrate W in the rinsing liquid and then quickly discharging the rinsing liquid from the inner bath 1 together with impurities, such as a processing liquid. In this embodiment, the quick dump rinse is selectively performed.

Figure 6:
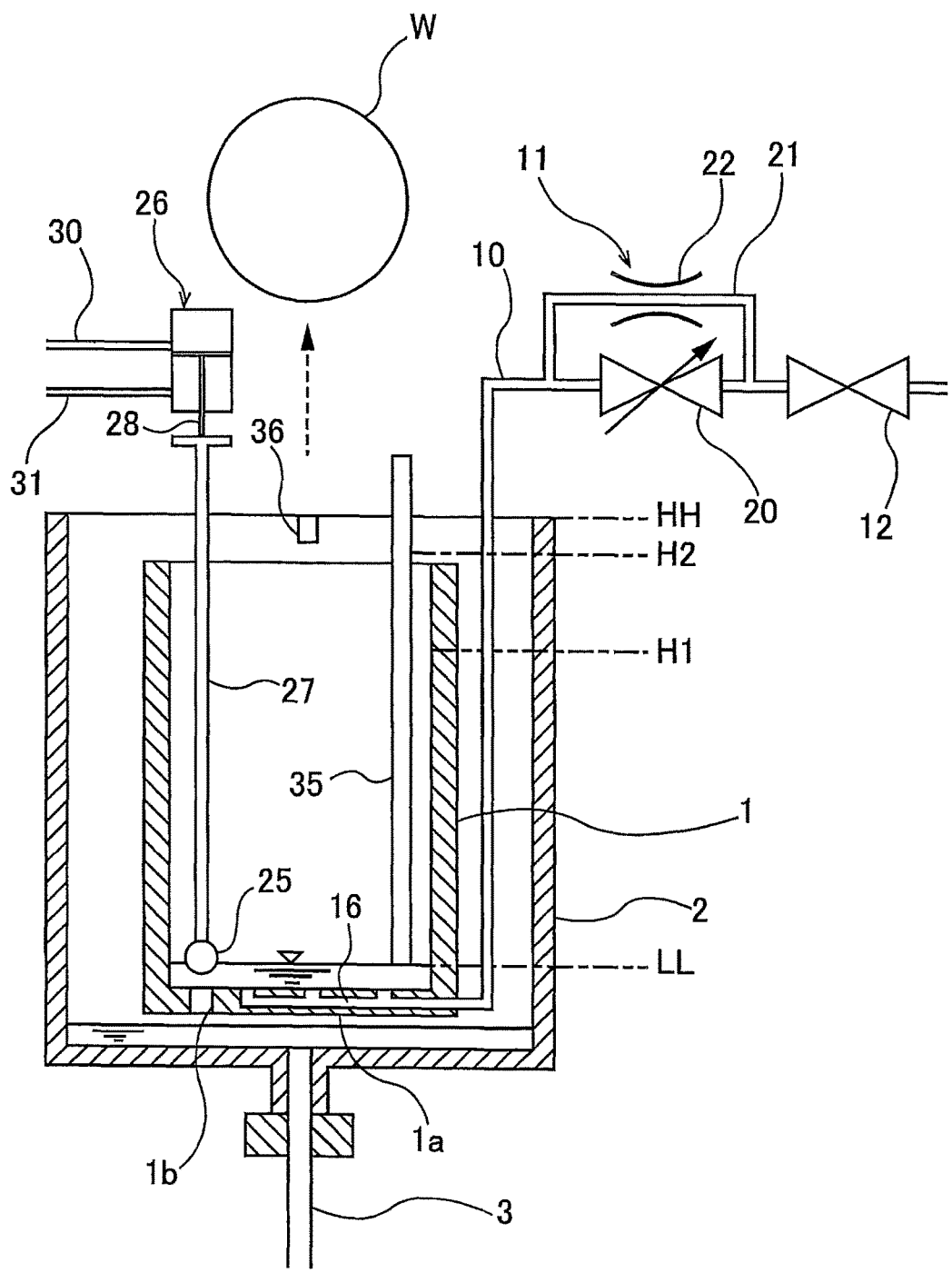
FIG. 6 is a view showing the rinsing bath when a stopper is elevated.

The flow chart in FIG. 3 shows an operation sequence in a case of performing the quick dump rinse. The on-off valve 20 is closed when the predetermined cleaning time has elapsed (step 9). Thereafter, the main valve 12 is closed (step 10), thereby stopping the supply of the rinsing liquid into the inner bath 1. The stopper 25 is then moved upwardly to the opening position by the pneumatic cylinder 26 (step 11), so that the drain hole 1b is opened. The rinsing liquid in the inner bath 1 flows through the drain hole 1b into the overflow bath 2, and is discharged through the drain pipe 3 to the exterior. When the level of the rinsing liquid is lowered to reach the lower limit level LL, the first level detector 35 detects the lower limit level LL (step 12). Thereafter, as shown in FIG. 6, the substrate W is pulled out of the inner bath 1 (step 13).

The operation controller 37 determines whether or not a preset delay time has elapsed from a point in time when the lower limit level LL is detected. If the delay time has elapsed (step 14), the stopper 25 is lowered to the closing position again (step 15), so that the drain hole 1b is closed with the stopper 25. The delay time is set for the following reason. When the first level detector 35 detects the lower limit level LL, the rinsing liquid slightly remains in the inner bath 1, as shown in FIG. 6. In this state, if the drain hole 1b of the inner bath 1 is closed, the rinsing liquid in the inner bath 1 is not completely expelled. Thus, when the preset delay time has elapsed since the lower limit level LL is detected, the drain hole 1b is closed with the stopper 25. The rinsing liquid remaining in the inner bath 1 is completely discharged until the delay time has elapsed.

Figure 7:
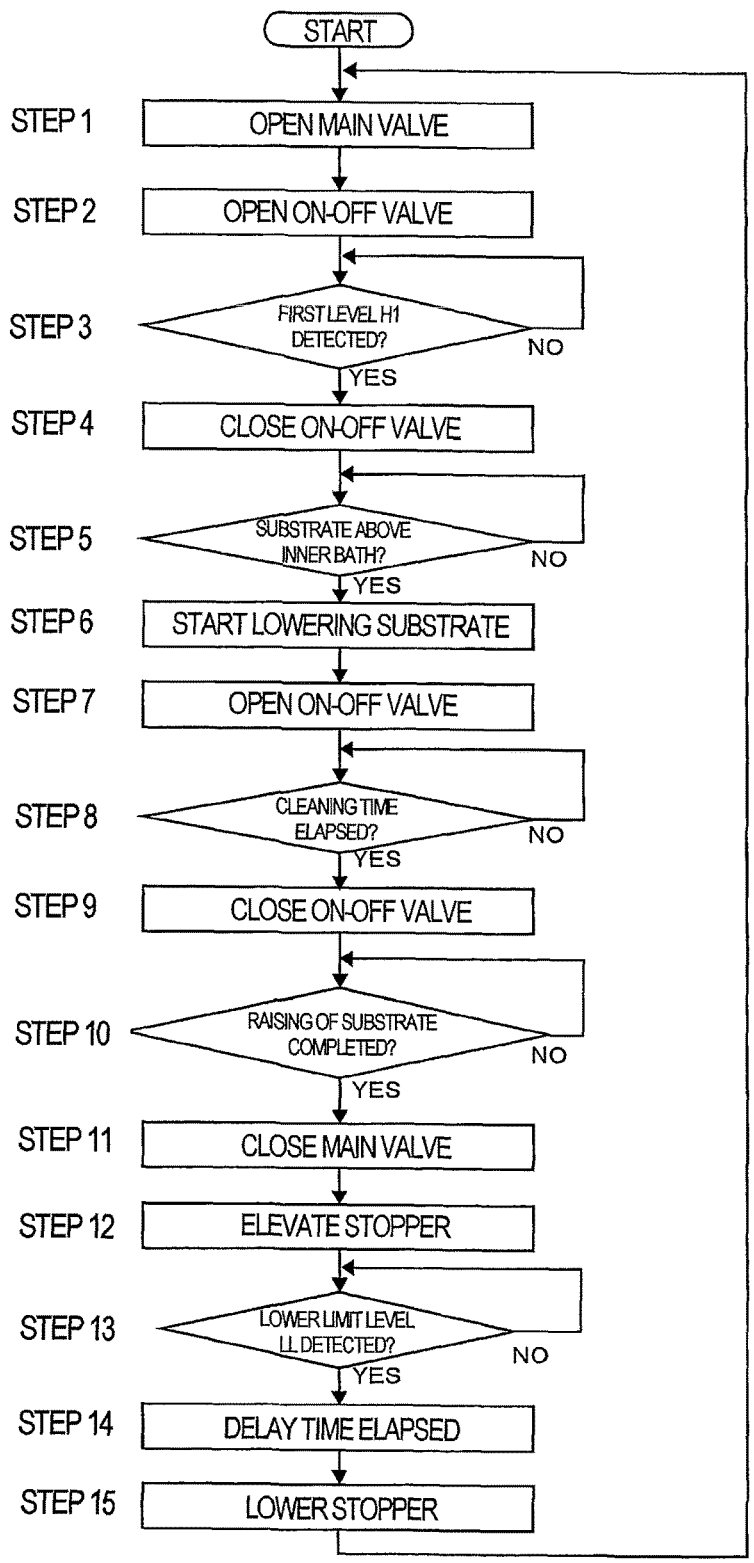
FIG. 7 is a flow chart showing a supply and discharge process of the rinsing liquid in a case where the quick dump rinse is not performed.

FIG. 7 is a flow chart showing a supply and discharge process of the rinsing liquid in a case where the quick dump rinse is not performed. The operations from step 1 to step 9 are the same as the operations shown in the flow chart of FIG. 3. In the case where the quick dump rinse is not performed, the substrate W is cleaned, the on-off valve 20 is then closed (step 9), and the substrate W is then raised from the inner bath 1 to a position above the inner bath 1 (step 10). After the substrate W is pulled out of the inner bath 1, the main valve 12 is closed (step 11), thereby stopping the supply of the rinsing liquid into the inner bath 1. Thereafter, the stopper 25 is elevated to the opening position by the pneumatic cylinder 26 (step 12), so that the rinsing liquid in the inner bath 1 is discharged. When the preset delay time has elapsed (step 14) since the first level detector 35 detects the lower limit level LL (step 13), the stopper 25 is lowered to the closing position (step 15), so that the drain hole 1b of the inner bath 1 is closed.

While the present invention has been described with reference to the embodiments thereof, it should be understood that the present invention is not limited to the particular embodiments described above, and that other modifications may be made within the technical concept of the present invention.

What is claimed is:

1. A rinsing bath for substrate processing comprising:
   an inner bath for holding a rinsing liquid therein;
   an overflow bath surrounding the inner bath and configured to receive the rinsing liquid that has overflowed the inner bath;
   a stopper disposed in the inner bath and configured to directly close a drain hole provided in a bottom of the inner bath, the drain hole providing a fluid communication between an inside of the inner bath and an inside of the overflow bath;
   an actuator configured to move the stopper between a closing position at which the stopper closes the drain hole and an opening position at which the stopper is away from the drain hole, wherein the actuator is disposed above the inner bath;
   a rinsing liquid supply pipe configured to supply the rinsing liquid into the inner bath; and
   a drain pipe coupled to a bottom of the overflow bath,
   wherein the entirety of the inner bath is located in the overflow bath, and
   wherein the inner bath is configured to immerse a substrate.

2. The rinsing bath according to claim 1, further comprising:
   a flow rate controller configured to change a flow rate of the rinsing liquid flowing through the rinsing liquid supply pipe.

3. The rinsing bath according to claim 2, further comprising:
   a level detector configured to detect a level of the rinsing liquid in the inner bath,
   wherein the flow rate controller is configured to allow the rinsing liquid to flow through the rinsing liquid supply pipe at a first flow rate until the level of the rinsing liquid reaches a predetermined level, and limit the flow rate of the rinsing liquid, flowing through the rinsing liquid supply pipe, to a second flow rate which is lower than the first flow rate, after the level of the rinsing liquid reaches the predetermined level.

4. The rinsing bath according to claim 2, wherein the flow rate controller comprises an on-off valve attached to the rinsing liquid supply pipe and a bypass pipe which bypasses the on-off valve.

5. The rinsing bath according to claim 1, wherein the rinsing liquid supply pipe is in a wall of the inner bath.

6. The rinsing bath according to claim 1, wherein the rinsing liquid supply pipe is in a bottom wall of the inner bath.

7. The rinsing bath according to claim 1, wherein an upper wall of the inner bath is lower than an upper wall of the overflow bath.

8. The rinsing bath according to claim 1, further comprising:
   a rod extending inside the inner bath, and coupled to the actuator above the inner bath and secured to the stopper in the inner bath, and
   wherein the actuator connects to a top of the drain hole inside of the inner bath through the rod and the stopper.

* * * * *